United States Patent [19]

Jon et al.

[11] Patent Number: 5,651,834
[45] Date of Patent: Jul. 29, 1997

[54] METHOD AND APPARATUS FOR $CO_2$ CLEANING WITH MITIGATED ESD

[75] Inventors: Min-Chung Jon, Princeton Junction, N.J.; Hugh Nicholl, Berthoud, Colo.; Peter Hartpence Read, Morrisville, Pa.

[73] Assignee: Lucent Technologies Inc., Murray Hill, N.J.

[21] Appl. No.: 521,495

[22] Filed: Aug. 30, 1995

[51] Int. Cl.⁶ .................................................. B08B 5/00
[52] U.S. Cl. ................................. 134/31; 134/6; 134/7; 134/9; 134/26; 134/72; 134/902; 451/38; 451/39; 451/75; 451/78
[58] Field of Search ................................ 134/6, 7, 9, 26, 134/902, 31, 72; 451/38, 39, 75, 78

[56] References Cited

U.S. PATENT DOCUMENTS

| | | | |
|---|---|---|---|
| 2,669,809 | 2/1954 | McGrath | 51/11 |
| 3,858,358 | 1/1975 | Stechowiak et al. | 51/8 |
| 4,412,402 | 11/1983 | Gallant | 51/439 |
| 4,535,576 | 8/1985 | Shukla et al. | 51/413 |
| 4,617,064 | 10/1986 | Moore | 134/7 |
| 4,631,250 | 12/1986 | Hayashi | 430/329 |
| 4,747,421 | 5/1988 | Hayashi | 134/201 |
| 4,974,375 | 12/1990 | Tada et al. | 51/413 |
| 5,009,240 | 4/1991 | Levi | 134/7 |
| 5,081,086 | 1/1992 | Endo et al. | 437/225 |
| 5,209,028 | 5/1993 | McDermott et al. | 51/426 |
| 5,240,018 | 8/1993 | Clark et al. | 134/64 R |
| 5,288,332 | 2/1994 | Pustilnik et al. | 134/27 |
| 5,354,384 | 10/1994 | Sneed et al. | 134/6 |
| 5,364,472 | 11/1994 | Heyns et al. | 134/7 |
| 5,409,418 | 4/1995 | Krone-Schmidt et al. | 451/75 |
| 5,447,577 | 9/1995 | Gao et al. | 148/23 |
| 5,545,073 | 8/1996 | Kneisel et al. | 451/39 |

OTHER PUBLICATIONS

G. Carter, "Streaming Potential ESD Shifts during Post Dicing High Pressure Spray Rinse Operation," 1991 EOS/ESD Symposium Proceedings, pp. 50–58.

*Primary Examiner*—Jill Warren
*Assistant Examiner*—Sharidan Carrillo
*Attorney, Agent, or Firm*—Robert B. Levy

[57] ABSTRACT

An object (12) may be cleaned by $CO_2$ reduced ESD by directing a first water mist (23) at a surface (14) of the object while imparting a relative motion between the object board and the mist to form a film of water on the object surface. As the relative motion is imparted between the board and the first mist (23), a second water mist (32) is injected into a stream (30) of solid $CO_2$ particles (27) directed at the object surface downstream of the first mist. Water droplets in the second mist in the second mist combine with the $CO_2$ particles to create carbonic acid that disassociates into charged ions that increase the conductivity of the water film, allowing for increased charge dissipation, thus reducing the incidence of ESD.

8 Claims, 1 Drawing Sheet

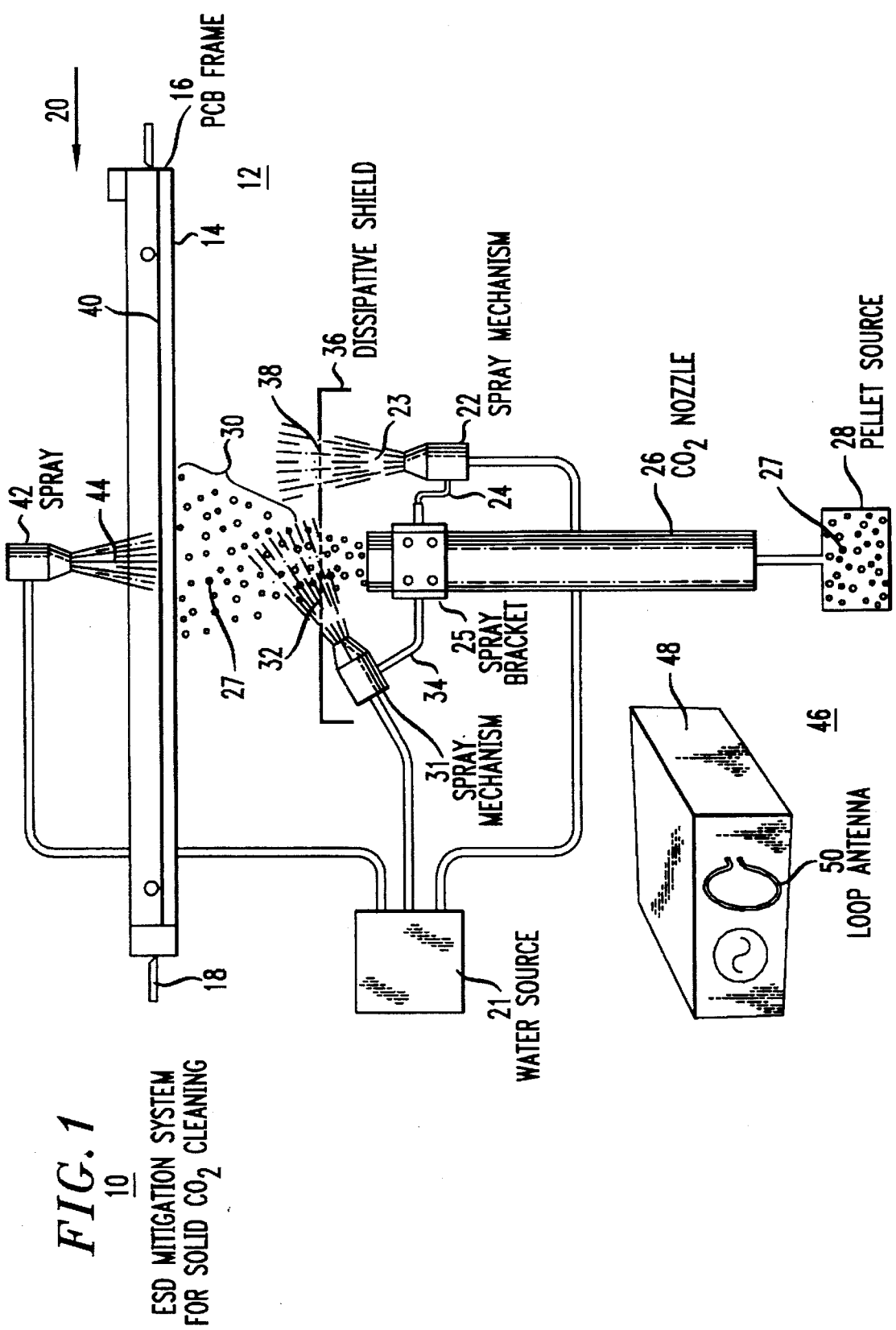

METHOD AND APPARATUS FOR $CO_2$ CLEANING WITH MITIGATED ESD

TECHNICAL FIELD

This invention relates to a method and apparatus for cleaning an object (e.g., a circuit board) by bombarding it with solid $CO_2$ particles while minimizing any electrostatic discharge (ESD) that occurs when the $CO_2$ particles strike the object.

BACKGROUND ART

After components are soldered to a circuit board, the board undergoes a cleaning operation to remove any residues that remain following soldering. For the most part, circuit boards are cleaned by washing them with a solvent capable of dissolving the undesirable residues. While solvent washing is an effective cleaning method, disposing of the spent solvent in an environmentally correct manner often imposes severe constraints. For that reason, cleaning a circuit board with solid carbon dioxide ($CO_2$) particles has become very attractive.

To clean a circuit board with solid $CO_2$ particles, the particles, either in the form of pellets or snow, are directed at the surface of the board. Upon contact, the $CO_2$ particles sublimate, effectively removing the residues on the board. Thus, the board surface is generally left clean and residue free. The waste stream resulting from $CO_2$ cleaning consists essentially of the residues removed from the board, imposing less environmental constraints than conventional solvent cleaning.

Despite the advantage of reduced environmental impact, $CO_2$ cleaning is not without its drawbacks. In particular, $CO_2$ cleaning usually results in electrostatic discharge (ESD), a serious problem. When solid $CO_2$ particles, which are cold and dry, strike the board surface, the particles tribocharge the circuit board. The level of charge on the circuit board can become high enough to breakdown the air surrounding the board, thereby creating ESD events. Certain electronic components are very sensitive to ESD. To date, circuit boards containing ESD-sensitive components cannot be cleaned by $CO_2$.

There are two possible approaches to reducing the ESD associated with $CO_2$ cleaning. One possible approach is to reduce or eliminate tribocharging of the board. In practice, reducing tribocharging has not proved feasible. The other approach is to mitigate ESD during $CO_2$ cleaning. One conventional method of mitigating ESD is to dissipate the charge generated during tribocharging by grounding the conductive areas on the circuit board. Unfortunately, charge may also build up on the non-conductive surfaces of the circuit board during $CO_2$ cleaning. Such surfaces, by their very nature, cannot be grounded. Thus, grounding, by itself, will not reduce ESD below a level at which a circuit board containing ESD-sensitive components can be safely cleaned. Additionally, grounding the conductive areas on each circuit board is not practical for most in-line cleaning processes.

Another approach to mitigating ESD generated during $CO_2$ cleaning is to spray the circuit board with a water mist to coat the surface with a film of water. The water film acts to dissipate charges built up during $CO_2$ cleaning. However, the water film usually will not eliminate ESD completely, partly because the water is not sufficiently conductive to carry away all of the charges that may build up on the board during $CO_2$ cleaning.

Thus, there is a need for a technique for cleaning a circuit board with $CO_2$ that mitigates ESD to sufficiently low levels acceptable for ESD-sensitive components.

BRIEF SUMMARY OF THE INVENTION

Briefly, in accordance with the invention, a method is disclosed for accomplishing $CO_2$ cleaning of an object, such as a circuit board, with reduced incidence of ESD. To accomplish such cleaning, a first mist of water is directed at a first surface of the object while a relative motion is imparted between the object and the first mist. In this way, a nearly continuous thin film of water is formed on the first surface of the object. As the object is displaced relative to the first mist, a second mist of water is injected into a stream of solid $CO_2$ particles. The combined stream of $CO_2$ particles and the second water mist is directed at the first surface of the object downstream of the first water mist while a relative motion is imparted between the object and the combined stream. This relative motion is the same as the relative motion imparted between the first mist and the object. The $CO_2$ particles directed at the first surface of the object sublimate on contact and advantageously remove residues that are present, leaving the first surface of the object essentially residue-free.

As the $CO_2$ particles strike the first surface of the object, the particles tend to tribocharge the object. However, the film of water created by directing the first mist of water at the first surface advantageously acts as a dissipative ground plane to provide a resistive path to ground for electrostatic charges that may build up on the first surface. In addition, the water in the second mist injected into the stream of $CO_2$ particles mixes with the $CO_2$ particles to form droplets of carbonic acid that dissociate into charged ions. As these charged ions are injected into the stream of $CO_2$ particles, the ions reduce the charge inherent on the $CO_2$ particles. Moreover, as the charged ions in the stream strike the film of water on the first surface, the charged ions mix with the water in the film to increase its electrical conductivity. Increasing the conductivity of the water film thus helps increase its ability to dissipate electric charge.

In some instances, it may be desirable to direct a third mist of water at a second surface of the object opposing the first surface as a relative motion is imparted between the third mist and the object. The third water mist acts to dissipate any electrostatic charges that appear on the second surface of the object as consequence of the $CO_2$ particles being directed at the first surface. Typically, when the $CO_2$ particles strike the first surface of the object, some charge will migrate to the second surface. The amount of charge that migrates to the second surface is smaller than the charge on the first surface. In practice, the third water mist has generally been found adequate to mitigate the charge on the second surface.

BRIEF DESCRIPTION OF THE DRAWING

FIG. 1 is a simplified plan view of an apparatus, in accordance with the invention, for cleaning a circuit board with $CO_2$ particles with reduced incidence of ESD.

DETAILED DESCRIPTION

FIG. 1 shows a system 10, in accordance with the invention, for cleaning an object 12, such as a circuit board, with solid $CO_2$ particles to remove residues from a first major surface 14 of the board while reducing the incidence of ESD associated with such cleaning. The system 10 includes a carrier 16, in the form of a printed circuit board frame, for releasably engaging the circuit board 12. A prime mover 18, in the form of a conveyor or the like, displaces the frame 16, and the circuit board 12 releasably engaged by the frame, along a rectilinear path, represented by the arrow 20.

A first spray mechanism 22 is spaced from the conveyor 18 for spraying a mist 23 of water at the circuit board 12 to strike the major surface 14 of the board generally perpendicular to the direction 20 of board travel. The mist 23 collects on the board surface 14 as the conveyor 18 transports, the circuit board 12 held by the frame 16 past the spray mechanism 22. In this way, a nearly continuous water film will form across the board surface 14.

In practice, the spray mechanism 22 generates the mist 23 by injecting water into a stream of compressed gas, such as air, that atomizes the water into tiny droplets that are carried to the surface 14 of the circuit board 12 by the compressed gas. Although air is typically employed, it may be desirable to employ $CO_2$ instead. By employing $CO_2$, the droplets of water will combine with the $CO_2$ to form carbonic acid that dissociates into charged ions that help to reduce the charge created when solid particles of $CO_2$ are directed at the first surface 14 of the circuit board 12 for cleaning purposes.

In practice, the spray mechanism 22 is secured by a first arm 24 to a spray bracket 25 attached to a $CO_2$ nozzle 26. The nozzle 26 is supplied with solid $CO_2$ particles 27 (e.g., snow or pellets) under pressure from a $CO_2$ particle source 28. The $CO_2$ nozzle 26 is positioned to shoot a stream 30 of $CO_2$ particles 27 at the circuit board surface 14 in a direction generally orthogonal to the direction 20 of board travel so the particles strike the board downstream of the first mist 23. As the particles 27 in the stream 30 strike the board surface 14, the particles sublimate and remove residues (not shown) on the board surface, leaving it clean and essentially residue free.

The particles 27, which are cold and dry, tribocharge the board 12, causing charge to build up on the surface 14. However, the film of water formed on the surface 14 by spraying the board with the mist 23 acts as a dissipative ground plane to the charges to ground. Ordinarily, the water film, by itself, will not dissipate the bulk of the charge built up on the circuit board surface 14 because the water film is a not a good conductor. Thus, a sufficient level of charge may remain on the board surface 14, resulting in ESD that might damage sensitive components (not shown) carded by the circuit board 12.

To further reduce the incidence of ESD, the cleaning system 10 of FIG. 1 advantageously includes a second spray mechanism 31 that generates a second water mist 32 in much the same manner than the spray mechanism 22 generates the mist 23. In practice, the spray mechanism 31 is mounted by an arm 34 to the bracket 25 attached to the $CO_2$ nozzle 26. Unlike the spray mechanism 22 whose mist 23 is directed at the circuit board surface 14, the mist 32 generated by the spray mechanism 31 is directed into the $CO_2$ particle stream 30. The water droplets in the mist 32 are thus injected in the $CO_2$ particle stream 30 and combine with the $CO_2$ particles 27 in the stream to form molecules of carbonic acid ($H_2CO_3$). The carbonic acid molecules formed in this manner dissociate into charged ions that distribute themselves within the water film on the surface 14 as the $CO_2$ stream 30 strikes the board surface. These charged ions significantly increase the conductivity of the water film, thereby significantly increasing the ability of the film to dissipate charge. As a result, the ESD that results from tribocharging of the board 12 caused by the $CO_2$ particles 27 striking the board surface 14 is significantly mitigated.

The ability of the water film formed on the board surface 14 by the mist 23 to dissipate charge can be increased by limiting the degree to which the mist scatters, and the degree to which the combined $CO_2$ particle stream 30 and mist 32 scatter after striking the board surface. In practice, both the mist 23, and the combined $CO_2$ particle stream 30 and mist 32 are under pressure in order to strike the board surface 14. Depending on the pressure, a portion of both the mist 23, as well as a portion of the combined $CO_2$ particle stream 30 and mist 32, will bounce back from the board surface 14 and then scatter. To reduce the incidence of scattering, a dissipative shield 36, formed from a charge-dissipating material having a plurality of apertures 38 therein, is interposed between the spray mechanisms 22 and 31 and the $CO_2$ nozzle 26. The shield 36 tends to confine both the mist 23, and the combined $CO_2$ particle stream 30 and mist 32, in the region between the board 12 and the shield. By confining both the mist 23 and the combined $CO_2$ particle stream 30 and mist 32 within the region between the board 12 and the shield 36, the film formed on the board surface 14 is more likely to be maintained on the board surface, than would be the case without the shield 36.

In many instances, the circuit board 12 may possess one or more apertures (not shown), such as tooling holes or the like, through which charges may pass from the surface 14 to an opposed major surface 40 of the board. Thus, charges can build up not only on the board surface 14, but on the board surface 40. For that reason, a third spray mechanism 42, similar to the spray mechanisms 22 and 31, is positioned opposite the board surface 40 for directing a water mist 44 at that surface generally normal to the direction 20 of board travel. As the board 12 travels along the path 20, the water mist 44 striking the board surface 40 creates a nearly continuous film of water on that surface. The water film on the board surface 40 acts to dissipate built-up electrical charge in much the same way that the water film on the board surface 14 dissipates built-up charge.

In practice, the combined mists 23, 32 and 44 have been found to mitigate nearly all ESD resulting from $CO_2$ cleaning of the board 12. Such mitigation has been verified by way of an ESD detector 46, which may take the form of a voltage-responsive measurement device 48, such as an oscilloscope, having an input coupled to a loop antenna 50. Note that it may be desirable to employ the ESD detector 46 to continuously monitor the level of ESD during $CO_2$ cleaning, especially when the circuit board 12 undergoing cleaning carries ESD-sensitive components (not shown). In the event that any or all of the spray mechanisms 22, 31 or 42 malfunctions, the ESD detector 46 will detect any increase in the incidence and level of ESD, thus allowing an operator to take corrective action before a large number of boards 12 are damaged.

The foregoing describes an apparatus 10 for cleaning an object, such as a circuit board 12, with $CO_2$ while reducing the incidence of ESD resulting from such cleaning.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method of cleaning an object, comprising the steps of:

directing a first mist of water at the object at a first position while simultaneously imparting a first relative motion between the first water mist and the object so that the first water mist forms a substantially continuous film of water across a first major surface of the object;

forming a stream of solid carbon dioxide ($CO_2$) particles;

directing a second mist of water into the stream of solid $CO_2$ particles to produce a combined stream of water mist and $CO_2$ particles; and directing the combined stream of water mist and $CO_2$ particles at the object at a second position while imparting a second relative motion between the combined stream and the object which motion is the same as the first relative motion imparted between the first mist and the object so that the object is displaced from said first position to said second position and the combined stream of water mist and $CO_2$ particles contact the first major surface of said object having the substantially continuous film of water formed therein, said contact of $CO_2$ particles substantially removing residue present on the first major surface of said object, thereby cleaning the object.

2. The method according to claim 1 further including the step of directing a third mist of water at a second surface of the object opposing the first surface while imparting a third relative motion between the third mist and the object which motion is the same as the first and second relative motions imparted between the object and the first mist and the object and the combined stream.

3. The method according to claim 1 further comprising the steps of:

monitoring the electrostatic discharge (ESD) generated upon contact of said $CO_2$ particles with the first major surface of said object; and interrupting the cleaning if the ESD exceeds a prescribed threshold.

4. The method according to claim 1 wherein each of the first and second mists of water is generated by injecting water into a compressed $CO_2$ gas stream.

5. An apparatus for cleaning an object having at least a first surface, comprising:

a means for transporting the object along a path from a first position to a second position;

a first spray mechanism including a source of water for directing a first water mist at the first surface of the object as the object is transported along the path to said first position to form a substantially continuous film of water across the first surface of said object, said film having a given conductivity value;

a means including a source of solid carbon dioxide ($CO_2$) for forming a stream of solid carbon dioxide ($CO_2$) particles;

a second spray mechanism comprising: a) a means including said source of water for directing a second mist of water into the stream of said solid $CO_2$ particles to form a combined stream of water mist and $CO_2$ particles in which the water droplets in the second mist combine with at least one of the $CO_2$ particles to produce carbonic acid ($H_2CO_3$); and b) a means for contacting the combined stream with the substantially continuous water film formed on said first surface as said object is transported from said first position to said second position, wherein said carbonic acid dissociates into charged ions which distribute within the water film, thereby increasing the conductivity value of the water film formed on said first surface, said contact of $CO_2$ particles in the combined stream substantially removing residue present on the first surface of said object, thereby cleaning the object.

6. The apparatus according to claim 5 further comprising a third spray mechanism for directing a third water mist at a second surface of the object.

7. The apparatus according to claim 5 further comprising a detector for detecting electrostatic discharge (ESD) generated upon contact of said $CO_2$ particles with the first major surface of said object.

8. The apparatus according to claim 5 further comprising a dissipative shield for shielding said object from the first and second spray mechanisms and the means for directing the stream of $CO_2$ particles at the first surface.

* * * * *